United States Patent
Shulman

(10) Patent No.: US 6,429,702 B2
(45) Date of Patent: *Aug. 6, 2002

(54) CMOS BUFFER FOR DRIVING A LARGE CAPACITIVE LOAD

(75) Inventor: Dima David Shulman, Marlboro, NJ (US)

(73) Assignee: Agere Systems Guardian Corp., Miami Lakes, FL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/345,059

(22) Filed: Jun. 30, 1999

(51) Int. Cl.$^7$ .............................................. H03F 3/26
(52) U.S. Cl. ........................ 327/111; 327/108; 330/264
(58) Field of Search ................................ 327/108, 111, 327/560, 427, 362, 562, 561, 563; 330/264, 252

(56) References Cited

U.S. PATENT DOCUMENTS 5,818,295 A * 10/1998 Chimura et al. ............ 327/111

OTHER PUBLICATIONS

R. Castello and P.R. Gray, "A High–Performance Micropower Switched–Capacitor Filter", IEEE J. Solid-State Circuits, vol. SC–20, pp. 1122–1132, (Dec. 1985).

P.R. Gray and R.G. Meyer, "Analysis and Design of Analog Integrated Circuits", $2^{nd}$ ed., New York, Wiley, pp. 755–756, (1984).

R. Harjani et al, "An Integrated Low–Voltage Class AB CMOS OTA", IEEE J. Solid–State Circuits, vol. 34, pp. 134–142, (Feb. 1999).

* cited by examiner

Primary Examiner—Dinh T. Le
(74) Attorney, Agent, or Firm—Ryan, Mason & Lewis, LLP

(57) ABSTRACT

A class AB buffer (or amplifier) is disclosed for driving a large capacitive load. The disclosed CMOS class AB buffer can drive capacitive loads, for example, in excess of 100 pF, while operating from a voltage supply as low as 1.5 volts. The disclosed class AB buffer includes a pair of driving transistors that are cross-coupled through an amplifier and level shifting circuitry, such as transistor circuitry, and a pair of current source transistors each having a gate terminal connected to an output of the corresponding amplifier and a gate terminal of an output transistor, and a drain terminal connected to a source terminal of the driving transistors. The driving transistors are prevented from entering a linear region by connecting a drain terminal of each of the driving transistors to a positive power supply voltage. The threshold voltage of only one transistor must be overcome before the transistors conduct current, since the gate-sources of the driving and current source transistors are not in series. Performance enhancements may be achieved by using cascode transistors in the input stage or output stage, or both. The stability of the circuit is ensured by selecting the capacitance of the load to ensure that a first non-dominant pole of the class AB buffer is greater than the unity gain bandwidth of the class AB buffer over substantially all operating conditions.

23 Claims, 2 Drawing Sheets

US 6,429,702 B2

CMOS BUFFER FOR DRIVING A LARGE CAPACITIVE LOAD

FIELD OF THE INVENTION

The present invention relates to amplifier circuitry, and more particularly, to amplifier circuitry for driving large capacitive loads.

BACKGROUND OF THE INVENTION

Buffers and amplifiers are widely used building blocks in many circuit applications. A number of classes of amplifiers have been established to meet the needs of various applications. Class A amplifiers, for example, are linear amplifiers in which the output current flows over the whole range of the input voltage. Class A amplifiers are said to have low distortion, but also low efficiency. Class AB amplifiers are amplifiers that deliver to and pull from a load a current that is larger than the DC quiescent current flowing in the class AB circuit. At low input signal levels, class AB amplifiers tend to operate as class A amplifiers. In addition, class AB amplifiers should have low, controlled DC output quiescent current. With proper design, the output current of a class AB amplifier should increase when a large differential voltage is applied. For a more detailed discussion of such classes of amplifiers, see, for example, P. R. Gray and R. G. Meyer, "Analysis and Design of Analog Integrated Circuits," 755–756 (2d ed. 1984).

Single-stage class AB amplifiers have been widely used to obtain good settling characteristics for a buffer that drives large capacitive loads. Class AB amplifiers and buffers often form part of a larger on-chip system that interfaces with external devices and are typically fabricated using CMOS transistor technology. As the CMOS processes are scaled to increase the circuit density for a given area of silicon, there is a corresponding increase in the complexity of the circuit design. In order to minimize the power dissipation, such CMOS circuits must operate at increasingly lower voltages, such as three volts (3 V), 1.8 V or even lower. Thus, there is a need to operate the class AB amplifiers or buffers contained on a CMOS chip using lower supply voltages, while driving large external capacitive loads. A video cable, for example, can provide a capacitive load on the order of 100 picofarads (pF).

SUMMARY OF THE INVENTION

Generally, a class AB buffer (or amplifier) is disclosed for driving a large capacitive load. The disclosed CMOS class AB buffer can drive capacitive loads, for example, in excess of 100 pF, while operating from a voltage supply as low as 1.5 volts. In addition, the disclosed CMOS class AB amplifier or buffer consumes very little quiescent current, while exhibiting a non-slewing transient response.

The disclosed class AB buffer includes a pair of driving transistors that are cross-coupled through an amplifier and level shifting circuitry, such as transistor circuitry, and a pair of current source transistors each having a gate terminal connected to an output of the corresponding amplifier and a gate terminal of an output transistor, and a drain terminal connected to a source terminal of the driving transistors. In this manner, maximum current can be obtained when the current source transistors are in the linear region (and are driving the output transistors that are typically in the saturation region). According to one aspect of the invention, the driving transistors are prevented from entering a linear region by connecting a drain terminal of each of the driving transistors to a positive power supply voltage. According to another aspect of the invention, only the threshold voltage of one transistor must be overcome before the transistors conduct current, since the gate-sources of the driving and current source transistors are not in series.

The performance of the disclosed class AB buffer may be further improved by using cascode p-channel transistors in an output stage to increase the gain. In one implementation, the cascode p-channel transistors are biased dynamically to maximize the output swing of the class AB buffer. In addition, a cascode current source can be used in an input stage between each of the driving transistors and the current source transistors to bias the driving transistors at the verge of saturation. The stability of the circuit is ensured by selecting the capacitance of the load to ensure that a first non-dominant pole of the class AB buffer is greater than the unity gain bandwidth of the class AB buffer over substantially all operating conditions.

DETAILED DESCRIPTION

Figure 1:
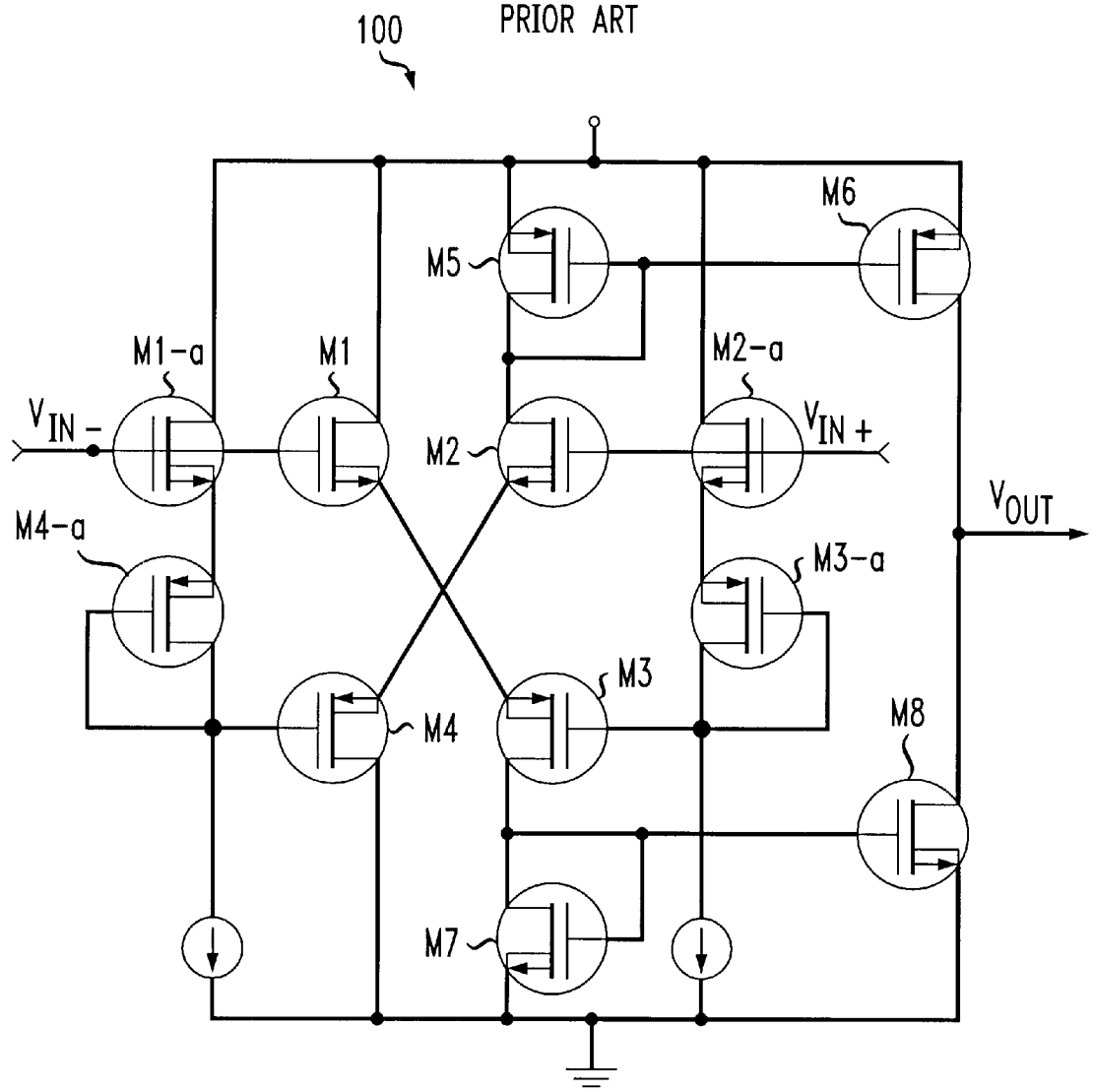
FIG. 1 is a schematic diagram of a conventional class AB amplifier.

FIG. 1 illustrates a typical conventional class AB amplifier 100. As shown in FIG. 1, the conventional class AB amplifier 100 receives a differential input signal $v_{in}-$ and $v_{in}+$, that is applied to transistors M1 and M2, respectively. M1 and M2 are n-channel transistors and M3 and M4 are p-channel transistors. The transistors M1-$a$, M2-$a$, M3-$a$ and M4-$a$ are utilized to bias the input stage, in a known manner. Thus, the bias transistors M1-$a$, M2-$a$, M3-$a$ and M4-$a$ provide level shifting of the input voltage ($v_{in}-$ or $v_{in}+$ shifted by a constant voltage).

The voltage applied to the gate of transistor M2 (shifted by the bias transistor M2-$a$ and M3-$a$) is transferred, for example, to the gate of M3. In order for the n and p-channel transistors to conduct, the voltage across the gate source must exceed a specified threshold (approximately 1 volt for CMOS transistors). The transistors M2 and M4 (and likewise M1 and M3) may be considered as a single transistor. The voltage across the gate source is determined by the relationship between the differential input signal $v_{in}-$ and $v_{in}+$. When $v_{in}+$ is much larger than $v_{in}-$, there is more voltage across the gate sources of M2 and M4, thus increasing the current through M2 and M4 (M1 and M3 are cutoff since the gate voltage is below threshold and M1 and M3 will not conduct current).

Since the gate source of transistor M1 (n-channel) is in series with the gate source of transistor M4 (p-channel) for the conventional class AB amplifier 100 of FIG. 1, the threshold voltages of both transistors must be overcome before the transistors conduct current. Thus, if the combined threshold voltage is 2 volts, and the power supply voltage is 3 volts, only 1 volt contributes to the generation of current, resulting in a small current and poor performance of the conventional class AB amplifier 100. For a large positive differential input signal, the current of the conventional class AB amplifier 100 increases and the input transistor M2 may be driven into the linear region of operation, where the output impedance is small and the conventional class AB amplifier 100 is an inefficient current source. Thus, the maximum output current of the conventional class AB amplifier 100 is limited. Clearly, the conventional class AB amplifier 100 of FIG. 1 cannot operate using a 2 volt power supply, because a voltage larger than the sum of thresholds of a p-channel and an n-channel device must be maintained in the circuit.

Figure 2:
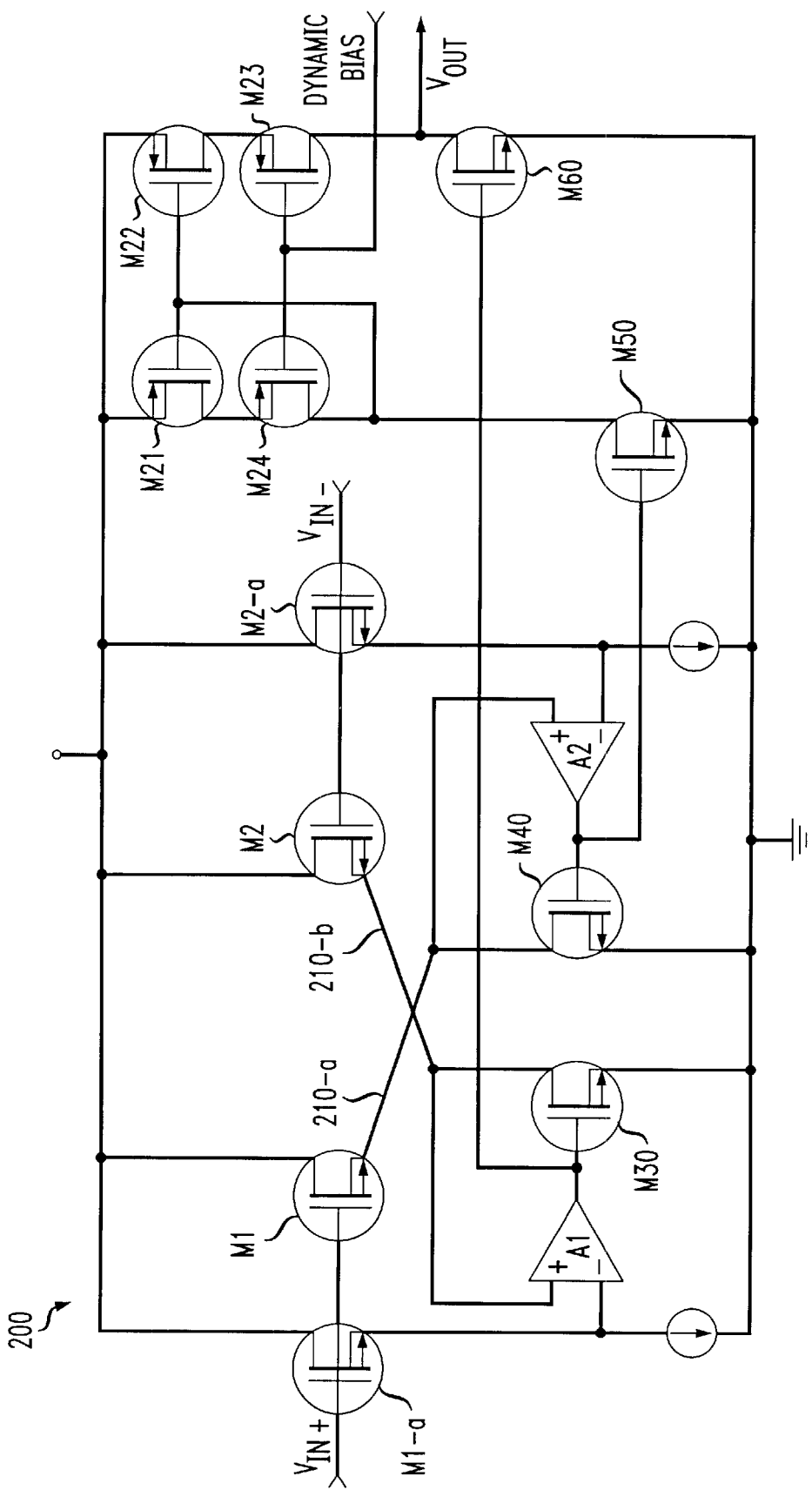
FIG. 2 is a schematic diagram of an embodiment of a class AB amplifier in accordance with the present invention.

According to one feature of the present invention, only the threshold voltage of a single transistor must be overcome before the transistors conduct current. FIG. 2 illustrates a class AB amplifier 200 in accordance with the present invention. It is noted that the transistors M1, M1-*a,* M2 and M2-*a* operate in the same manner as the corresponding transistors of FIG. 1. Generally, when a positive differential input signal $v_{in}+$ and $v_{in}-$, is applied to the class AB amplifier 200, the applied voltage is transferred across the input n-channel transistor M1, M2, respectively. As discussed further below, for a small input signal, the output and input stage currents are nearly equal. When the applied voltage increases, large output currents can be generated while the transistors M30 and M40 are in the saturation region. The maximum output current is obtained when M30 and M40 are driven into the linear region. The output of the class AB amplifier 200 is the only high-impedance node in the signal path.

The output stage optionally uses cascode p-channel transistors M21–M24 to increase the gain, in a known manner. It is noted that the illustrative implementation is designed for a power supply voltage of 1.8 volts. The class AB amplifier 200 can be reconfigured for a power supply voltage of 1.5 volts, for example, by shorting the transistors M23 and M24. Furthermore, the cascode p-channel transistors M21–M24 are biased dynamically, in a known manner, to maximize the output swing of the class AB amplifier 200. For a discussion of dynamic biasing of cascode p-channel transistors, see, R. Castello and P. R. Gray, "A High-Performance Micropower Switched-Capacitor Filter," IEEE J. Solid-State Circuits, Vol. SC-20, 1122–1132, (December 1985), incorporated by reference herein. When $v_{in}+$ is much larger than $v_{in}-$, there is more voltage across the gate source of M1 than M2, thus increasing the current conducting through M1 and M40, (M2 and M30 are cutoff since the gate voltage is below threshold; thus, M1 and M30 will not conduct current). As the current increases through transistor M40, the gate source voltage of the transistor M40, which is connected to the output of the amplifier A2, increases, respectively.

Likewise, the negative inputs of the amplifiers A1 and A2 are connected to the biased voltages from the bias transistors, M2-*a* and M1-*a,* respectively. The outputs of the amplifiers A1 and A2 are connected to the gates of transistors M30 and M40, respectively, as well as the gates of transistor M60 and M50, respectively.

With proper selection of an amplifier A2 (whose output operates between the full range of the power supply rails, within a few millivolts), an efficient driver can be designed. Since the input transistors M1 and M2 are not driven into the triode region for any input signal level, the maximum current is obtained when the transistors M30 and M40 are in the linear region (and are driving the transistors M50 (and thus M22) and M60 that are typically in the saturation region). If transistors M30 and M40 are driven by high output swing amplifiers, the maximum gate-source voltage of transistors M30 and M40 is equal to the power supply voltage.

MOSFET devices exhibit a strong channel modulation effect, effectively increasing drain currents with drain-source voltages. This effect benefits the speed performance of the current design, since the drain-source voltages of transistors M30 and M40 are much smaller than the drain-source voltages of input transistors M1 and M2. The present invention takes advantage of the physics of submicron MOSFET devices. Since transistors M1 and M40 (and M2 and M30) carry the same current, an increase in the gate-source voltages of transistors M1 and M2 results in larger increases in the gate-source voltages of transistors M30 and M40. While the transistors M30 and M40 are in the saturation region, $V_{out}$ is brought to ground, and the capacitive load discharges. During the large portion of the transient response, the drain-source voltage of output transistor M60 is much larger than the drain-source voltage of transistor M30 (but transistors M30 and M60 have the same gate voltage since they are connected to the same node). Therefore, the current through transistor M60 is larger than the current through transistor M30. The gate-source voltage of transistors M30 and M40 and thus, the output current, can be increased further if the transistors M30 and M40 are driven into the linear region.

As shown in FIG. 2, the class AB amplifier 200 includes a cross-coupled configuration 210, where a pair of driving transistors M1 and M2 are cross-coupled through amplifiers A1 and A2, respectively, and bias or level shifting circuitry, such as the transistors M2-*a* and M1-*a,* respectively. The gate of transistor M40 is not in the signal path of transistor M1 (and likewise the gate of transistor M30 is not in the signal path of transistor M2). The gate of transistor M40 is connected to the output of the amplifier A2, as well as the gate of transistor M50. In fact, the gate source of transistor M1 is connected in series with the drain of transistor M40 (and not the gate source of M40). Since the gate source of transistor M1 is not in series with the gate source of transistor M40 for the class AB amplifier 200 of FIG. 2, only the single threshold voltage of each transistor must be overcome before the transistors conduct current. The common-mode input range of the class AB amplifier 200 is similar to that of a differential pair, and is significantly wider than the highly asymmetrical common-mode input range of the conventional class AB amplifier 100 of FIG. 1.

According to a further feature of the present invention, the driving transistors M1 and M2 remain in the saturation region and are prevented from entering the linear (triode) region by connecting the drains of the driving transistors M1 and M2 to the positive power supply voltage. In this manner, as the input voltage increases, more current is available from the driving transistors M1 and M2 (now efficient current sources). The currents from the driving transistors M1 and M2 drive the corresponding current sources transistors M30 and M40 into the linear region. As $v_{in-}$ decreases, the negative input of amplifier A2 decreases. Therefore, due to the virtual short characteristics of the amplifier, the positive input of amplifier A2 also decreases, and thereby decreases the source voltage of M1. Meanwhile, the increasing $v_{in+}$ increases the voltage across the gate of M1 causing the current through transistor M1 and thus the current through M40 to increase. Thus, the transistor M40 is driven into the linear region.

The gate voltages from the current sources transistors M30 and M40 then drive the output transistors M60 and M22 (via M5), which typically remain in the saturation region.

STABILITY ANALYSIS

In addition to the dominant pole, the class AB amplifier 200 displays two poles and one zero, that can be shown to be approximately located at:

$$p_1 = -\frac{g_{m40}}{g_{m1}}UGB_{A2}$$

$$p_2 = -\frac{g_{m1}}{C_{gs1}+C_{A2}}UGB_{A2}\frac{g_{m40}}{g_{m1}}$$

where, $$z = -\frac{g_{m1}}{C_{gs1}}$$

and $g_{m1}$ and $g_{m40}$ are the transconductance of transistors M1 and M40, respectively. $C_{gs1}$ is the gate source capacitance of the transistor M1, and $C_{A2}$ is the input capacitance of the auxiliary amplifier, and $UGB_{A2}$ is the unity gain bandwidth of the auxiliary amplifier. The unity gain frequency of the class AB amplifier 200 is given by:

$$UGB_m = \frac{g_{m1}}{C_L}$$

where $C_L$ is the load capacitance. It can be shown that poles in the open-loop transfer function can be avoided if the following condition is satisfied:

$$\frac{g_{m1}}{C_{gs1}+C_a} > 4\frac{g_{m40}}{g_{m1}}UGB_a$$

As a result, the maximum unity gain bandwidth of the auxiliary amplifier, $UGB_a$, and the first pole are determined. It is also clear from the above equation that the first pole, $p_1$, is the first non-dominant pole which determines the phase margin of the amplifier 200. This, however, is not adequate in order to determine the buffer stability. While the input transistors M1 and M2 always remain in the saturation region and their transconductance increases with current, the transistors M30 and M40 may enter the linear region where their transconductance, $g_m$, is determined by the device geometry and the drain-source voltage, and does not depend on the current. The transconductance ratio of transistors M40 and M1 can be close to unity for small input signal levels for similar size devices, but much smaller than one for large input signal levels.

The first dominant pole, $p_1$, moves correspondingly from being approximately at the unity gain bandwidth of the auxiliary amplifier, $UGB_a$, for small input signal levesl to lower frequency for large input signal levels. At the same time, the unity gain frequency of the buffer, $UGB_m$, is increasing because $g_{m1}$ is increasing with current. Consequently, the circuit 200 may exhibit frequency response with significant phase margin, but become unstable during the transient response. For stable operation of the circuit, the load capacitance, $C_L$, should be large enough so that $UGB_m<p_1$, for any operating conditions of the class AB amplifier 200. The fact that transistor M40 is driven into the linear region can be exploited to enhance current capabilities of the buffer. Using a cascode current source (n-channel transistor) in the input stage, between the input transistor M1 and the current source transistor M40, and likewise between the input transistor M2 and the current source transistor M30, can bias transistor M2 at the verge of saturation. In this manner, the current source transistors are driven into the linear region faster, and the speed and thus performance of the class AB amplifier 200 increases. Even a small increase in the input stage current drives transistor M40 into the linear region, maximizing the gate-source voltage of transistor M40, and correspondingly, the output current.

However, the first dominant pole, $p_1$, is shifted even to lower frequencies in comparison to a circuit (not shown) without cascode transistors, when a large input signal voltage is applied, since M40 is operating in the triode region with a small drain-source voltage, so that its transconductance is reduced. This may result in a ringing transient response. If, however, the load capacitance is increased to guarantee that $UGB_m<p_1$, then the speed benefit of using the cascode current sources is clear (high slew-rate).

It is to be understood that the embodiments and variations shown and described herein are merely illustrative of the principles of this invention and that various modifications may be implemented by those skilled in the art without departing from the scope and spirit of the invention.

I claim:

1. An input class AB stage of a buffer for generating a current for a large capacitive load, comprising:
   level shifting circuitry that biases an applied differential input signal;
   a pair of cross-coupled driving transistors that each receive said biased applied differential input signal at a gate terminal;
   at least one amplifier having a first input connected to a gate source terminal of one of said driving transistors and a second input connected to said level shifting circuitry; and
   a pair of current source transistors that generate an output current for said load, wherein each of said current source transistors have a gate terminal connected to an output of said at least one amplifier and a drain terminal connected to said gate source terminal of one of said driving transistors, wherein said pair of driving transistors are cross-coupled through said at least one amplifier and said level shifting circuitry, wherein said driving transistors are prevented from entering a linear region for substantially all input voltages.

2. The class AB buffer of claim 1, wherein said driving transistors are prevented from entering the linear region by connecting a drain terminal of each of said driving transistors to a positive power supply voltage.

3. The class AB buffer of claim 1, wherein said pair of current source transistors each have a gate terminal of an output transistor.

4. The class AB buffer of claim 1, further comprising cascode p-channel transistors in an output stage to increase a gain of said class AB buffer.

5. The class AB buffer of claim 4, wherein said cascode p-channel transistors are biased dynamically to maximize an output swing of said class AB buffer.

6. The class AB buffer of claim 3, further comprising a cascode current source in an input stage, between each of said driving transistors and said current source transistors to bias said driving transistors at a verge of saturation of said current source transistors.

7. The class AB buffer of claim 3, wherein the gate-sources of said driving and current source transistors are not in series.

8. The class AB buffer of claim 3, wherein the gate source of said driving transistors are in series with the drain of said current source transistors.

9. The class AB buffer of claim 1, wherein the level shifting circuitry comprises transistor circuitry.

10. The class AB buffer of claim 1, wherein a capacitance of said load is selected to ensure that a first pole of said class AB buffer is greater than the unity gain bandwidth of the class AB buffer.

11. The class AB buffer of claim 3, wherein the drain-source voltage of said output transistor is much larger than the drain-source voltage of said current source transistor and the current through said output transistor is larger than the current through said current source transistor.

12. An input class AB stage of a buffer for generating a current for a large capacitive load, comprising:
   level shifting circuitry that biases an applied differential input signal;
   a pair of cross-coupled driving transistors that each receive said biased applied differential input signal at a gate terminal;
   at least one amplifier having a first input connected to a gate source terminal of one of said driving transistors and a second input connected to said level shifting circuitry that are cross-coupled through said at least one amplifier and said level shifting circuitry; and
   a pair of current source transistors that generate an output current for said load, each of said current source transistors having a gate terminal connected to an output of said amplifier and a gate terminal of an output transistor, and a drain terminal connected to a source terminal of said driving transistors, wherein said current transistors operate in a linear region for a range of input values.

13. The class AB buffer of claim 12, wherein said driving transistors are prevented from entering the linear region.

14. The class AB buffer of claim 13, wherein said driving transistors are prevented from entering the linear region by connecting a drain terminal of each of said driving transistors to a positive power supply voltage.

15. The class AB buffer of claim 12, further comprising cascode p-channel transistors in an output stage to increase a gain of said class AB buffer.

16. The class AB buffer of claim 15, wherein said cascode p-channel transistors are biased dynamically to maximize an output swing of said class AB buffer.

17. The class AB buffer of claim 12, further comprising a cascode current source in an input stage between each of said driving transistors and said current source transistors to bias said driving transistors at a verge of saturation of said current source transistors.

18. The class AB buffer of claim 12, wherein the gate-sources of said driving and current source transistors are not in series.

19. The class AB buffer of claim 12, wherein the gate source of said driving transistors are in series with the drain of said current source transistors.

20. The class AB buffer of claim 12, wherein the level shifting circuitry comprises transistor circuitry.

21. The class AB buffer of claim 12, wherein a capacitance of said load is selected to ensure that a first pole of said class AB buffer is greater than the unity gain bandwidth of the class AB buffer.

22. The class AB buffer of claim 12, wherein the drain-source voltage of said output transistor is much larger than the drain-source voltage of said current source transistor and the current through said output transistor is larger than the current through said current source transistor.

23. A method for generating a current for a large capacitive load, comprising:
   applying a differential input voltage to a pair of driving transistors that are cross-coupled through an amplifier and level shifting circuitry;
   maintaining said driving transistors in a saturation region for substantially all input voltages;
   driving a pair of current source transistors into a linear region, wherein said current source transistors have a gate terminal connected to an output of said amplifier and a gate terminal of an output transistor, and a drain terminal connected to a source terminal of said driving transistors; and
   driving said output transistors using said current source transistors.

* * * * *